(12) United States Patent
Goel et al.

(10) Patent No.: US 8,966,419 B2
(45) Date of Patent: Feb. 24, 2015

(54) SYSTEM AND METHOD FOR TESTING STACKED DIES

(75) Inventors: Sandeep Kumar Goel, Dublin, CA (US); Ashok Mehta, Los Gatos, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 184 days.

(21) Appl. No.: 13/546,037

(22) Filed: Jul. 11, 2012

(65) Prior Publication Data

US 2014/0015583 A1      Jan. 16, 2014

(51) Int. Cl.
*G06F 17/50* (2006.01)
*G06F 9/455* (2006.01)

(52) U.S. Cl.
USPC ........... 716/113; 716/122; 716/129; 716/130; 716/134

(58) Field of Classification Search
USPC .......................... 716/113, 122, 129, 130, 134
See application file for complete search history.

(56) References Cited

U.S. PATENT DOCUMENTS

| | | | |
|---|---|---|---|
| 7,827,519 B2 * | 11/2010 | Scheffer et al. | 716/54 |
| 8,245,176 B2 * | 8/2012 | Silvestri | 716/126 |
| 8,561,001 B1 * | 10/2013 | Goel | 716/130 |
| 8,751,994 B2 * | 6/2014 | Goel | 716/122 |
| 2007/0240083 A1 * | 10/2007 | Hiroi et al. | 716/1 |
| 2012/0266125 A1 * | 10/2012 | Carpenter et al. | 716/122 |

\* cited by examiner

*Primary Examiner* — Stacy Whitmore
*Assistant Examiner* — Magid Dimyan
(74) *Attorney, Agent, or Firm* — Duane Morris LLP

(57) ABSTRACT

Systems and methods are disclosed for testing a stack of dies and inserting a repair circuit which, when enabled, compensates for a delay defect in the die stack, particularly where the defect is located in the inter-die data transfer path. Intra-die and inter-die slack values are determined to establish which die or dies in the die stack would benefit from the insertion of a repair circuit.

18 Claims, 5 Drawing Sheets

SYSTEM AND METHOD FOR TESTING STACKED DIES

BACKGROUND

Three-dimensional ("3D") and/or 2.5D integrated circuits ("ICs") are becoming more prevalent in semiconductor architecture. The increased density of dies and the costs associated with manufacturing these dies dictates that the testing performed on dies must make full use of all good dies. Current testing schemes that test one die at a time as if each die was to be used as a stand-alone chip do not take into account the reality that dies may be stacked together and operated as a stack. Typically, dies in a stack of dies are connected through a data transfer connection which may include one or more micro-bumps. These micro-bumps, or any other connection method, may be subject to defects which would cause the injection of a defect delay value in the connection between dies. For example, micro-bumps may be misaligned, uneven, or make contact in a less-than-optimum manner.

The injection of a defect delay value may negatively impact the proper operation of the downstream die in the die stack since the delay may cause data being sent to the downstream die to not reach a data storage circuit in time to be latched. Thus, an incorrect data value may be passed further through the die stack.

Faults within a die, or within the connection between dies, can generally be classified into one of two categories: hard defects and weak defects. Hard defects, such as stuck faults, are typically easy to detect and generally are those types of faults that are always present and cause permanent failure. Weak defects, on the other hand, are harder to detect and may cause additional delay, based on the defect size, in a circuit within a die or between dies in a die stack. Examples of weak defects include a resistive via, a partial missing connection between components within the die, misalignment of micro-bumps, etc. Each of these, and other, types of weak defects induce a timing delay within a die or between dies in a die stack.

Each die, whether operated in a stand-alone manner or as part of a stack of dies, typically has a timing budget which may include slack time, e.g., the time between when a data bit reaches a data storage circuit and the time when the data storage circuit latches the data bit before sending the latched data bit off to the next component, either within the same die or to another die in the stack of dies. In most instances, each die in a stack of dies operates within its own clock domain. The different clock domains for dies within a stack of dies and/or the existence of available path slack within a die present an opportunity to make advantageous use of these timing differences.

DETAILED DESCRIPTION

With reference to the figures where like elements have been given like numerical designations to facilitate an understanding of the present subject matter, various embodiments of a system and method for testing a stack of dies and for compensating for a delay defect in a connecting path between dies in a die stack are described. Additionally, systems and methods are disclosed for inserting a repair circuit which, when enabled, compensates for a delay defect in the die stack. Intra-die and inter-die slack values are determined to establish which die or dies in the die stack would benefit from the insertion of a repair circuit. In order to more fully understand the present subject matter, a brief description of applicable circuitry will be helpful.

Figure 1:
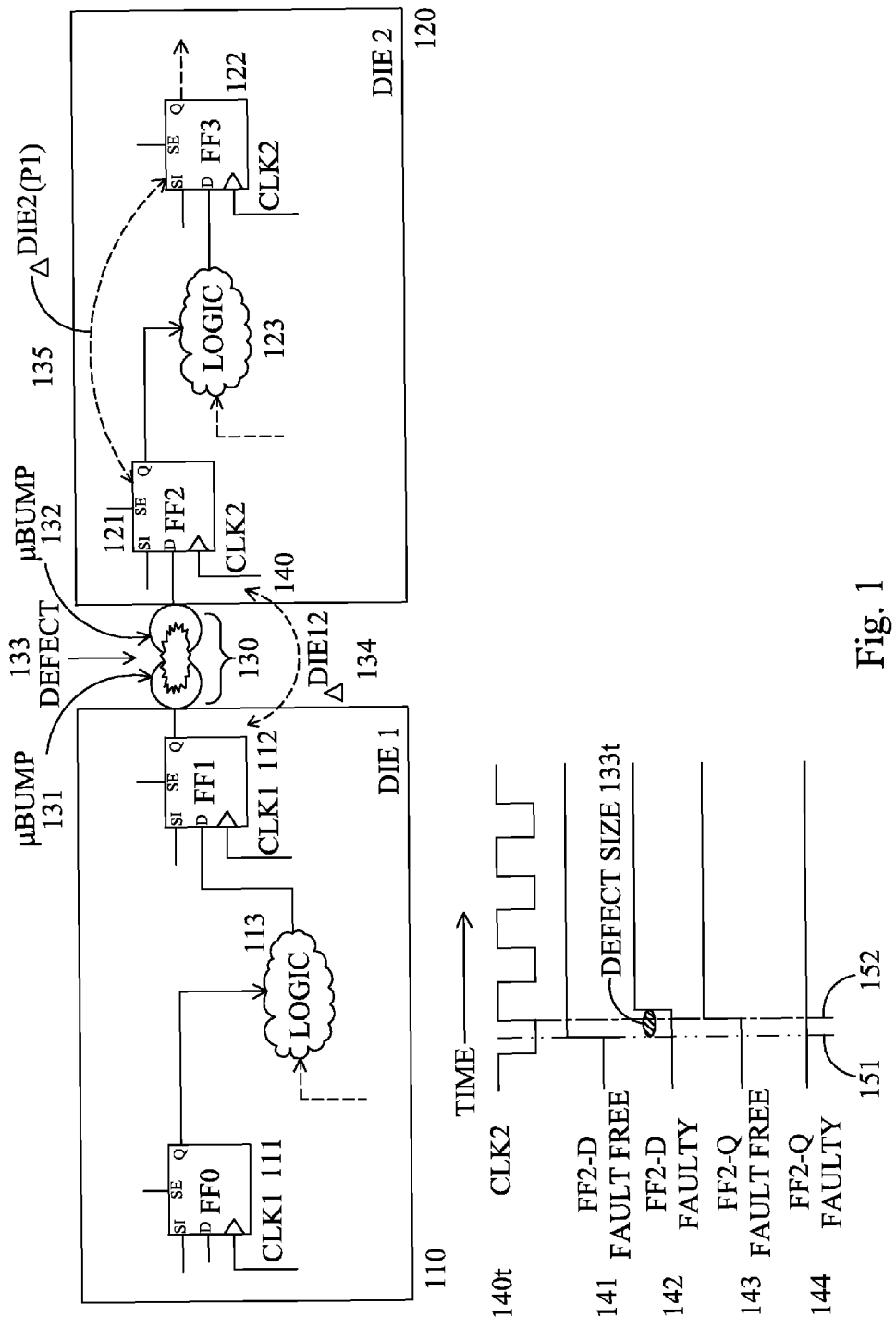
FIG. 1 is a block diagram representation of two dies in a prior art die stack showing a defect in one an inter-die path between the dies, and an exemplary timing chart for the downstream die.

FIG. 1 is a block diagram representation of two dies in a prior art die stack showing a defect in a data transfer connection 130 between the dies, and an exemplary timing chart for the die stack with the defect. Die 1, 110, and Die 2, 120, are shown as part of a die stack. Die 1 includes a data storage circuit 111, designated FF0, and a data storage circuit 112, designated FF1. These data storage circuits may be of any type known in the art including, but not limited to, flip-flops, latches, and scan flip-flops (which may contain both data and scan/test input). Although FF0 and FF1 are depicted as being the same type of data storage circuit, FF0 and FF1 need not necessarily be the same. In the embodiment depicted in FIG. 1, FF0 is a scan flip-flop for data entering Die 1 and FF1 is a scan flip-flop for data exiting Die 1 and being sent to Die 2. As is known in the art, FF0 and FF1 each include input and output lines. Of interest to the present subject matter, one of those inputs includes a clock signal, designated herein as CLK1, as shown. Another of the inputs is a data input designated as "D" in FF0 and FF1, as shown. A data output line from FF0 and FF1 is designated as "Q" in FF0 and FF1, as shown. Die 1 also includes logic circuitry 113. The data output of FF0, designated herein as FF0-Q, is input to the logic circuitry 113 and then input into the "D" line of FF1, FF1-D.

Considering Die 2, Die 2 includes data storage circuit 121, designated FF2, and data storage circuit 122, designated FF3. FF2 and FF3 are data storage circuits which, in a certain embodiment, are similar to FF0 and FF1, discussed above. Die 2 also includes logic circuitry 123 on the data output line to FF2 and going to the data input line of FF3. FF2 and FF3 are clocked with a clocking signal designated CLK2 which may be the same as CLK1 or may be a different clock signal than CLK1 in which case Die 1 and Die 2 operate in separate clock domains. The clock signal going into FF2 is designated 140. In certain embodiments, the clock signal for FF2 may be different than the clock signal for FF3.

Between Die 1 and Die 2 is a data transfer connection 130. In certain embodiments, the data transfer connection 130 includes one or more micro-bumps, such as micro-bump 131 and micro-bump 132. A defect 133 may occur in the data transfer connection 130. Defect 133 may inject a time delay into the data transfer connection 130 which causes the data being transferred from FF1 to FF2 to arrive after clock signal 140 latches FF2, thereby latching the current data value at FF2-D, which may not be the correct data value.

In operation, the output of FF1, FF1-Q, is input to FF2 via the data transfer connection 130, on the data input line FF2-D.

The path between FF1 and FF2 has a timing budget, or timing margin, which can be determined by known methods, and is designated as $\Delta^{DIE12}$ otherwise referred to herein as path slack 134. Path slack 134 is determined without and delays injected by defect 133. Since path slack 134 traverses Die 1 and Die 2, path slack 134 is an inter-die path slack. Similarly, the path between FF2 and FF3 has a timing budget, or timing margin, which can be determined by known methods, and is designated as $\Delta^{DIE2}(P1)$ otherwise referred to as path slack 135. Since path slack 135 is within Die 2, path slack 135 is an intra-die path slack.

With attention now directed towards the timing chart in FIG. 1, various timing events are depicted, with time traveling from left to right, as shown. Graph 140*t* shows a typical signal for CLK2. Graph 141 shows a notional data signal arriving at the data input line D of FF2, i.e., FF2-D, from the data output Q of FF1, i.e., FF1-Q, via data transfer connection 130. As shown in the timing chart, the data arrives at FF2-D, as shown by line 151, prior to the rising edge of clock signal CLK2, as shown by line 152. In the embodiment shown, the rising edge of CLK2 triggers FF2 so that the signal present at FF2-D at that time is latched, as shown in graph 143 for the output data from FF2, FF2-Q. Note that as shown in graph 141, the defect 133 is not present.

Graph 142 shows a similar notional data signal arriving at FF2-D from FF1-Q via data transfer connection 130 but in this case defect 133 causes a delay, defect size 133*t*, in the reception of the data signal at FF2-D. The effect of the delay inserted by defect 133 causes the data signal to arrive at FF2-D after the rising edge of CLK2, as shown by line 152. As discussed above, the reception of the rising edge of CLK2 triggers FF2 so that the signal present at FF2-D at that time is latched. However, due to the time delay 133*t* injected by defect 133, the data signal from FF1-Q has not yet arrived at FF2-D when CLK2 triggers FF2. Consequently, as shown in graph 144, FF2 latches an incorrect data reading at FF2-Q and, at the appropriate clock signal, FF2-Q sends a faulty data signal to FF3.

Figure 2:
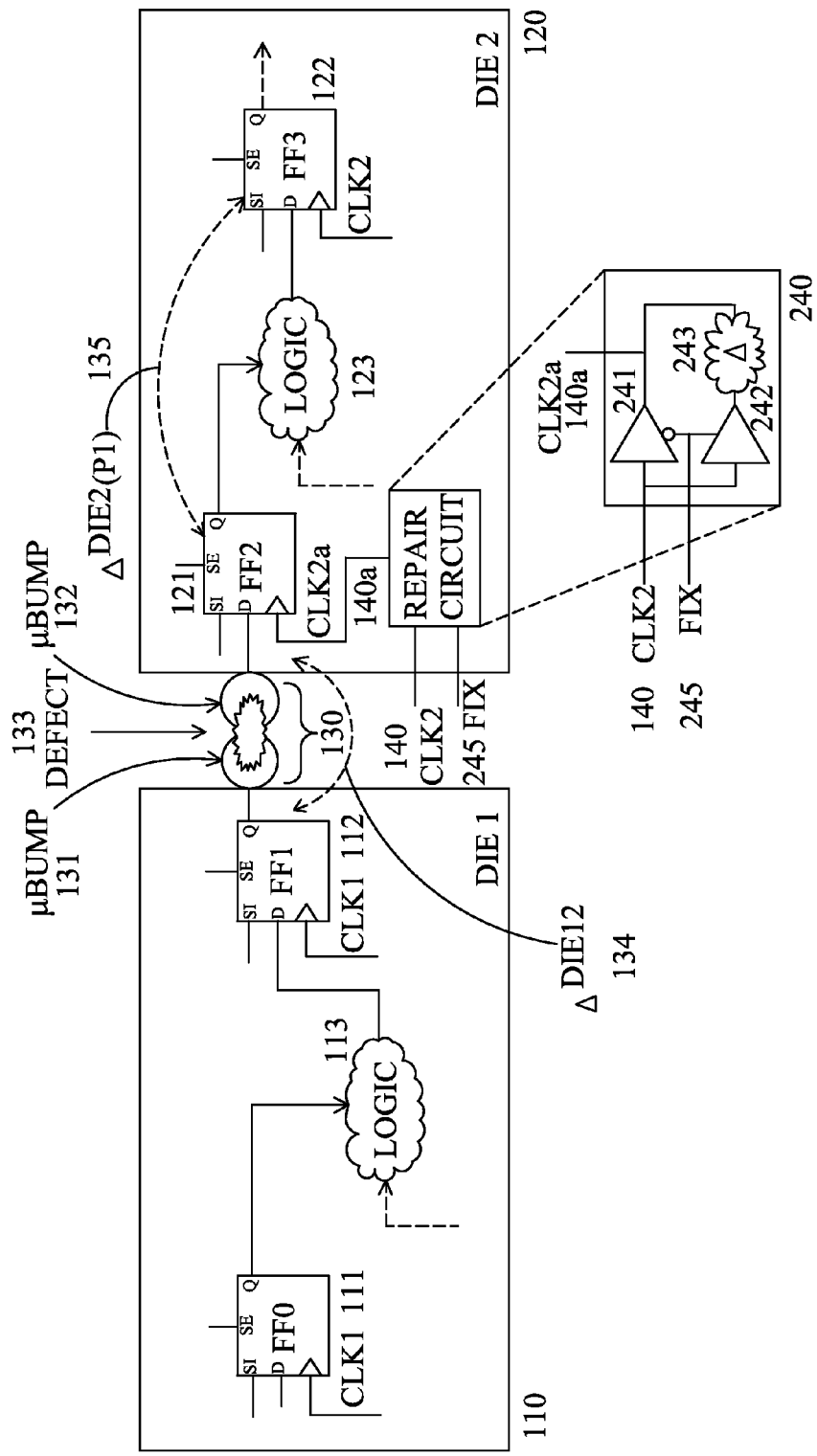
FIG. 2 is a block diagram representation of two dies in a die stack showing an exemplary repair circuit in the die downstream of the defect, according to an embodiment of the present subject matter.

FIG. 2 is a block diagram representation of the two dies in a die stack shown in FIG. 1 with the inclusion of an exemplary repair circuit 240 in Die 2. The description of Die 1 and Die 2, their internal components and pathways, and the data transfer connection 130 between the dies are as described above for FIG. 1.

Regarding Die 2 in FIG. 2, the repair circuit 240 is placed in the clock line for FF2, as shown. The clock signal CLK2, 140, is input into repair circuit 240 rather than directly into FF2. The repair circuit 240 also has an input for a "FIX" signal 245, the purpose of which will be explained below. The inset of FIG. 2 shows an exemplary circuit architecture for repair circuit 240 including circuits 241 and 242 and delay 243, which includes a delay value "Δ". In the absence of FIX signal 245, repair circuit 240 operates to pass clock signal CLK2, without adding delay 243, to FF2 as clock signal CLK2a, 140*a*. In the presence of FIX signal 245, repair circuit 240 operates to pass clock signal CLK2 to FF2, but adds delay 243, as clock signal CLK2a. It will be readily understood by those of skill in the art that the exemplary circuit architecture shown for repair circuit 240 is non-limiting in nature and other circuit architectures that operate in a similar manner to the description above for repair circuit 240 are contemplated herein.

The amount of delay added to clock signal CLK2 by delay 243 depends on the timing margin available in slack path 135. If the delay injected by defect 133 is less than or equal to the timing margin available in slack path 135, then the timing margin in slack path 135 may be "borrowed" by delay 243 in repair circuit 240 to overcome the effects resulting from delay 133 in the data transfer connection 130. Thus the maximum value of the delay "Δ" in delay 243 is:

$$\Delta \leq \Delta^{DIE2}(P1)$$

While only one intra-die slack path is shown in Die 2 in FIG. 2, more than one intra-die slack path is contemplated by the present subject matter starting from FF2. Thus, for an embodiment in which there is more than one slack path available, the maximum value of "Δ" will be less than or equal to the smallest of the Die 2 intra-die slack paths beginning at FF2. Once the maximum delay value for "Δ" is determined, the value of Δ may be set to a predetermined value less than or equal to the maximum. Alternatively, Δ may be selectable between a number of predetermined values and, further, may be programmable by known methods, where the programmed values need not be hard-wired into the repair circuit 240. Naturally, if the amount of delay injected by defect 133 is less than the slack value in inter-die slack path 134, then repair circuit 240 need not be enabled to introduce delay 243 into the clock signal CLK2a for FF2.

Figure 3:
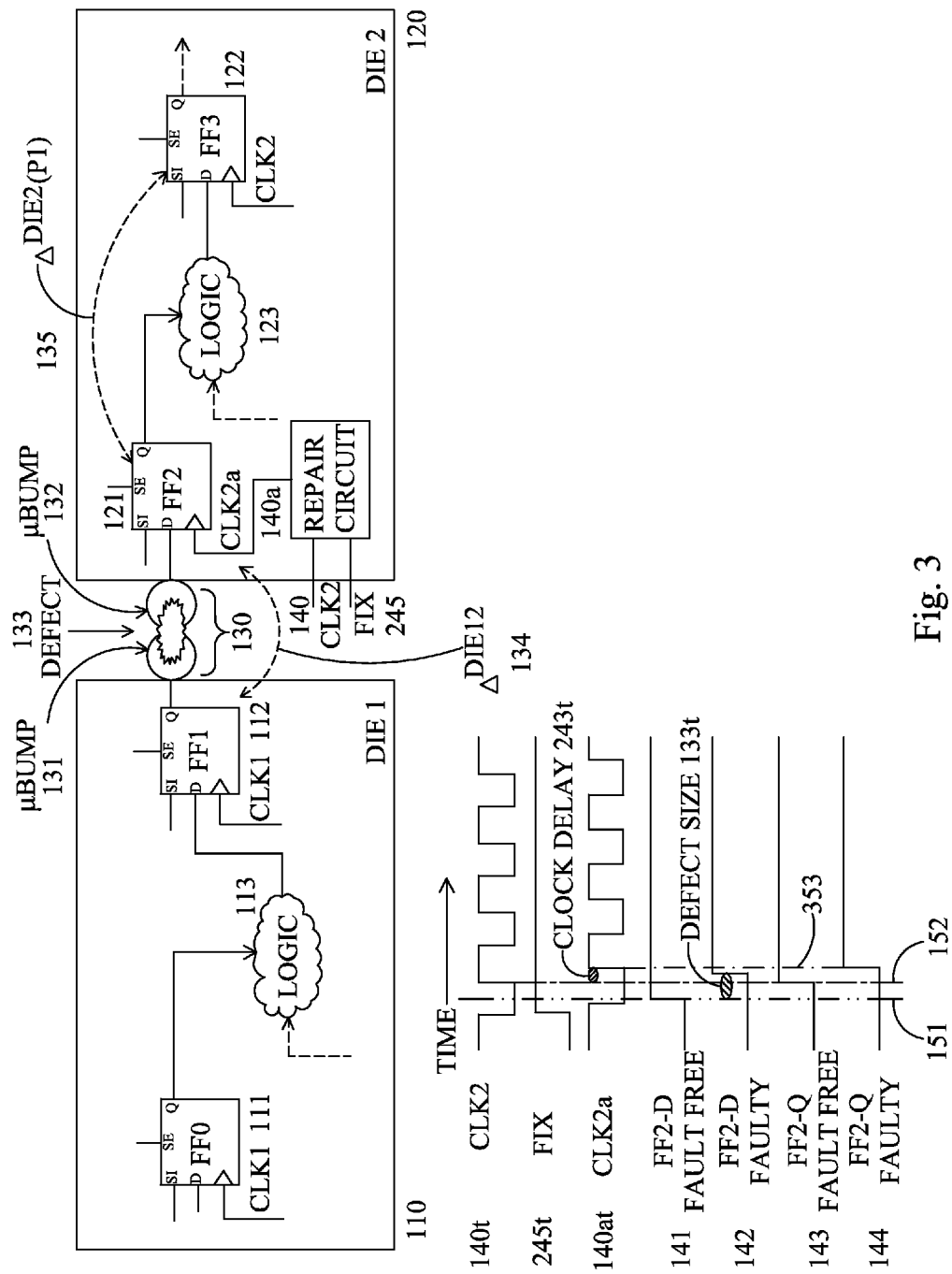
FIG. 3 is a block diagram representation of two dies in a die stack showing an exemplary repair circuit in the die downstream of the defect, and an exemplary timing chart for the downstream die, according to an embodiment of the present subject matter.

With focus now on FIG. 3, a block diagram representation of the two dies in a die stack shown in FIG. 2 is presented. The description of Die 1 and Die 2, their internal components and pathways, and data transfer connection 130 are as described above for FIG. 2 and will not be repeated here. In addition to Die 1 and Die 2, FIG. 3 illustrates an exemplary timing chart for Die 2, showing both the effect of defect 133 and the effect of repair circuit 240. Time progresses from left to right, as shown.

Graph 140*t* shows a typical signal for CLK2, as described above in FIG. 1. Graph 245*t* shows a notional FIX signal which will enable repair circuit 240 to insert a clock delay 243*t* (referred to as delay Δ for device 243 as described above with respect to FIG. 2). Graph 140*at* shows the output of the repair circuit 240, delayed clock signal CLK2a which is input into FF2, with the insertion of clock delay 243*t*. Note that the clock signal CLK2a is delayed from clock signal CLK2 by the amount of clock delay 243*t*.

Graph 141, as described above in FIG. 1, shows a notional data signal arriving at the data input line D of FF2, i.e., FF2-D, from the data output Q of FF1, i.e., FF1-Q, via data transfer connection 130. As shown, the data arrives at FF2-D, as shown by line 151, prior to the rising edge of clock signal CLK2, as shown by line 152. Since, when repair circuit 240 is enabled, clock signal CLK2a is delayed from clock signal CLK2, the data arrives at FF2-D, as shown by line 151, prior to the rising edge of clock signal CLK2a. Note that as shown in graph 141, the defect 133 is not present.

Graph 142, as described above in FIG. 1, shows a similar notional data signal arriving at FF2-D from FF1-Q via data transfer connection 130 but in this case defect 133 injects a delay, defect size 133*t*, in the reception of the data signal at FF2-D. While the effect of the delay inserted by defect 133 causes the data signal to arrive at FF2-D after the rising edge of CLK2, as shown by line 152, since FF2 is now clocked by CLK2a (when repair circuit 240 is enabled), which is delayed from CLK2, the data signal arrives at FF2-D prior to the rising edge of CLK2a, as shown by line 353. Since the reception of the rising edge of CLK2a now triggers FF2, the signal present at FF2-D at the time of reception of the rising edge of CLK2a is latched, which, as shown in the exemplary timing charts, is the correct value. This is shown in graph 144 where FF2 latches the correct data value at the rising edge of clock signal CLK2a as shown by line 353. Thus, the correct data value appears at FF2-Q for transmission to FF3. Accordingly, the insertion of clock delay 243*t* when repair circuit 240 is enabled overcomes the effect of the delay 133t injected by defect 133. Thus, the die stack, with the inclusion of repair circuit 240, operates in an acceptable manner and need not be rejected.

As contemplated by embodiments of the present subject matter, repair circuit 240 may be implemented in a cascade fashion such that, for example, a single FIX signal may be used to enable more than one cascaded repair circuit. Additionally, testing of the different dies in a stack may result in a list of available slack paths which may be used to reorder the dies, for example, in order of increasing slack. Thus, it is then possible to add a repair circuit to a minimum number of dies in the die stack with a minimum of slack "borrowing" between dies.

Figure 4:
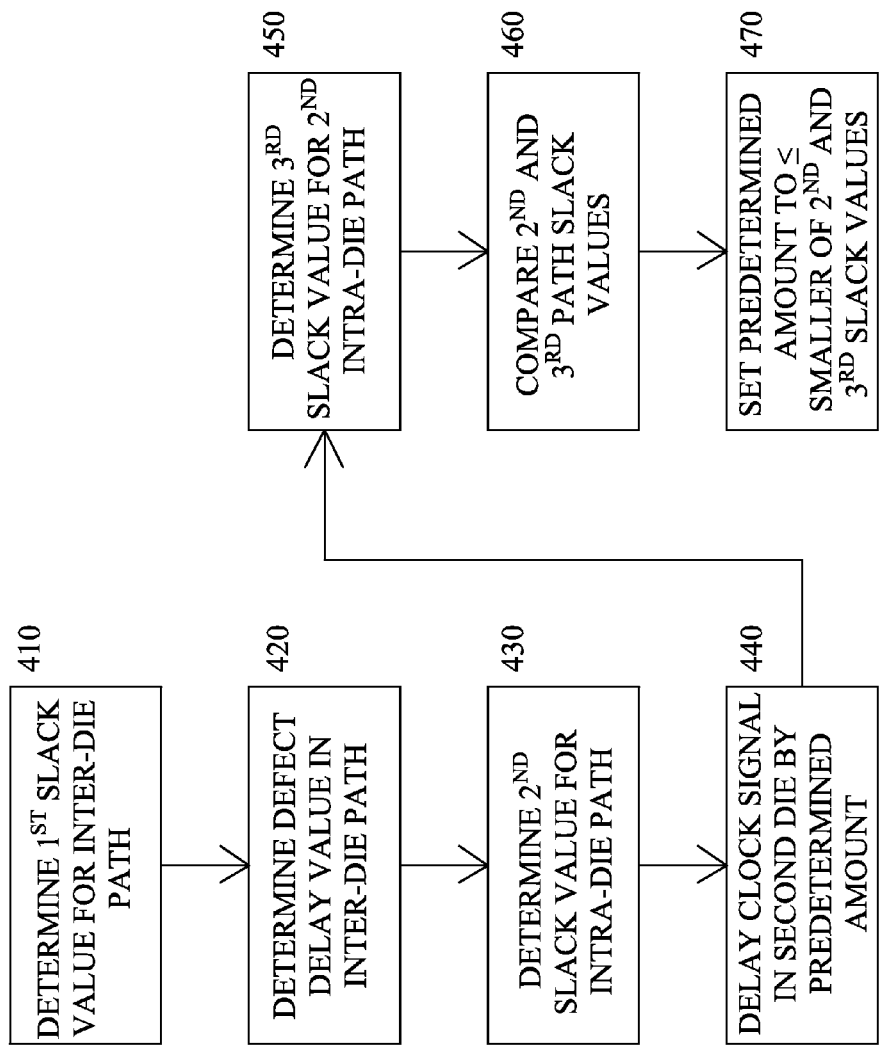
FIG. 4 is a flow chart for a method for compensating for a delay defect in a die stack according to an embodiment of the present subject matter.

Considering FIG. 4, a flow chart is presented for a method for compensating for a delay defect in a die in a die stack according to an embodiment of the present subject matter. At block 410, a first slack value for an inter-die path between a first and a second die in a die stack is determined. The first inter-die path begins at a first circuit in the first die, such as a flip-flop, latch, or scan flip-flop. At block 420, a defect delay value in the inter-die path is determined. At block 430, a second slack value for an intra-die path in the second die in the die stack is determined. The second inter-die path also begins at the first circuit in the first die. At block 440, a clock signal to a data storage circuit in the second die is delayed by a predetermined amount. In an additional embodiment, the method may further include blocks 450-470. At block 450, a third slack value for a second intra-die path in the second die in the die stack is determined. The third inter-die path also begins at the first circuit in the first die. At block 460, the second and third slack values are compared and, at block 470, the predetermined amount of delay is set to be less than or equal to the smaller of the second and third slack values.

Figure 5:
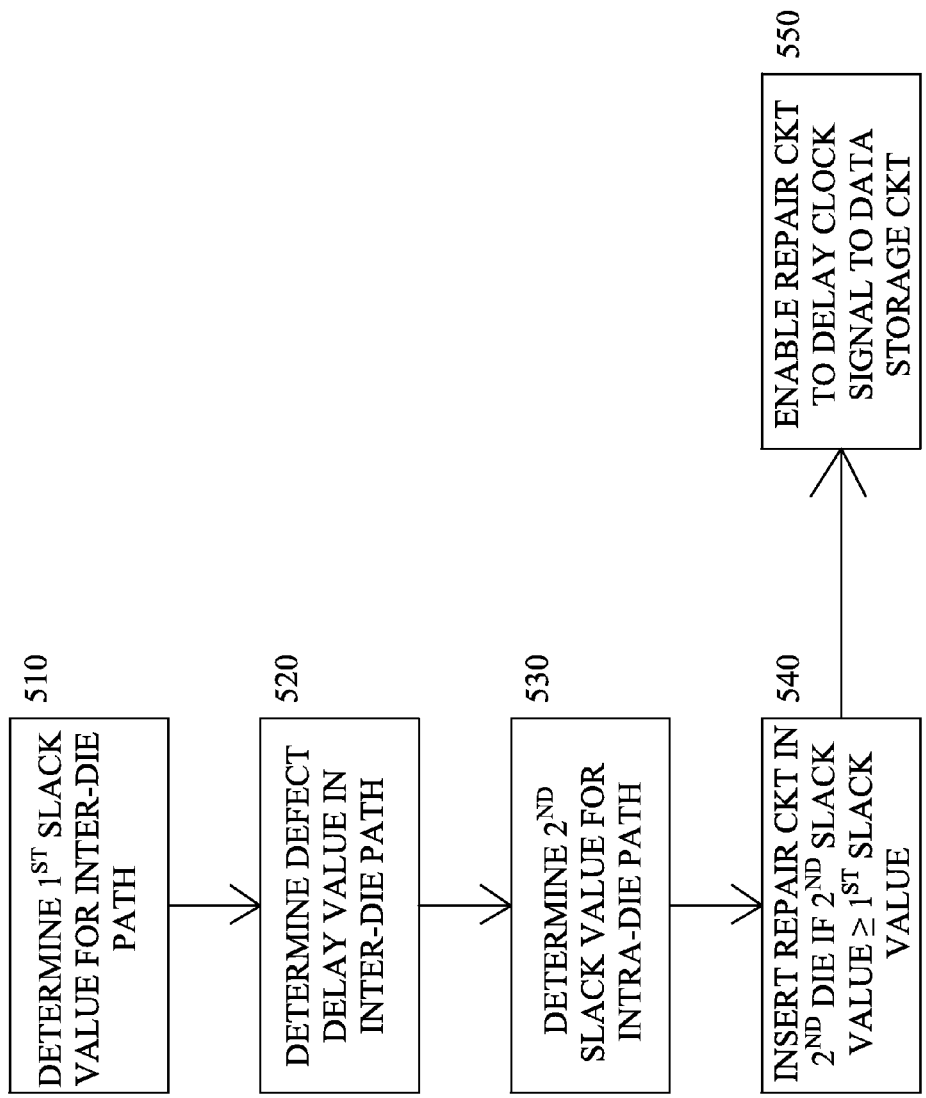
FIG. 5 is a flow chart for a method for testing a die stack according to an embodiment of the present subject matter.

Considering FIG. 5, a flow chart is presented for a method for testing a die stack according to another embodiment of the present subject matter. At block 510, a first slack value for an inter-die path between a first and second die in a die stack is determined. At block 520, a defect delay value in the inter-die path is determined. At block 530, a second slack value for an intra-die path in the second die in the die stack is determined. At block 540, a repair circuit is inserted in the second die if the second slack value is greater than or equal to the first slack value. In an additional embodiment, the repair circuit is enabled so as to delay a clock signal to a data storage circuit in the second die by a predetermined amount.

According to an embodiment of the present subject matter, a method for compensating for a delay defect in a die stack is described. The method includes determining a first path slack value for an inter-die path between a first die and a second die in the die stack, determining a defect delay value in the inter-die path, determining a second path slack value for an intra-die path in the second die, and delaying a clock signal to a data storage circuit in the second die by a predetermined amount.

According to another embodiment of the present subject matter, a method for testing a die stack is described. The method includes determining a first path slack value for an inter-die path between a first die and a second die in the die stack, determining a defect delay value in the inter-die path, determining a second path slack value for an intra-die path in the second die, and inserting a repair circuit in the second die if the second path slack value is greater than or equal to the first path slack value.

According to yet another embodiment of the present subject matter, a system for compensating for a delay defect in an inter-die path in a die stack having a first and a second die is described. The system includes a first die having a first data storage circuit. The system also includes a second die having a second data storage circuit, a third data storage circuit, an intra-die path for passing information from the second data storage circuit to the third data storage circuit where the intra-die path has a second path slack value, and a repair circuit operatively connected to the second data storage unit. The system further includes an inter-die path for passing information from the first data storage circuit to the second data storage circuit where the inter-die path has a defect-free first path slack value and the inter-die path having a defect delay value. In operation, the repair circuit delays a clock signal to the second data storage circuit by a predetermined amount if the defect delay value is greater than the first path slack value and if the defect delay value is less than or equal to the second path slack value.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method for compensating for a delay defect in a die stack, the method comprising:
   determining a first path slack value for an inter-die path between a first die and a second die in the die stack;
   determining a defect delay value in the inter-die path;
   determining a second path slack value for an intra-die path in the second die; and
   delaying a clock signal to a data storage circuit in the second die by a predetermined amount via a repair circuit in the second die.

2. The method of claim 1 wherein the predetermined amount is less than or equal to the second path slack value.

3. The method of claim 2 wherein the defect delay value is greater than the first path slack value.

4. The method of claim 1 further comprising:
   determining a third path slack value for a second intra-die path in the second die; and
   comparing the second path slack value to the third path slack value,
   wherein the predetermined amount is less than or equal to the smaller of the second and third path slack values.

5. The method of claim 1 wherein the predetermined amount of delay is programmable.

6. The method of claim 1 wherein the predetermined amount of delay is selectable.

7. The method of claim 1 wherein the first die operates in a first clock domain and the second die operates in a second clock domain.

8. The method of claim 1 wherein the inter-die path includes a micro-bump.

9. The method of claim 1 wherein the clock signal inputs into the repair circuit in the second die.

10. A system for compensating for a delay defect in a die stack, the system comprising:
    a first die in said die stack;
    a second die connected to the first die in the said die stack, wherein the second die further comprising:
    a data storage circuit;
    a repair circuit;
    and
    an inter-die path for passing information between said first die and said second die, said inter-die path having a first path slack value and a defect delay value;

an intra-die path within the second die, said intra-die path having a second path slack value;

wherein said repair circuit delays a clock signal to said data storage circuit by a predetermined amount.

11. The system of claim 10 wherein the predetermined amount is less than or equal to second path slack value.

12. The system of claim 11 wherein the defect delay value is greater than the first path slack value.

13. The system of claim 10 wherein the predetermined amount is less than or equal to the smaller of the second path slack value and a third path slack value for a second intra-die path in the second die.

14. The system of claim 10 wherein the predetermined amount of delay is programmable.

15. The system of claim 10 wherein the predetermined amount of delay is selectable.

16. The system of claim 10 wherein the first die operates in a first clock domain and the second die operates in a second clock domain.

17. The system of claim 10 wherein the inter-die path includes a micro-bump.

18. The system of claim 10 wherein the clock signal inputs into the repair circuit in the second die.

\* \* \* \* \*